United States Patent [19]
Bush et al.

[11] Patent Number: 5,986,283
[45] Date of Patent: Nov. 16, 1999

[54] TEST STRUCTURE FOR DETERMINING HOW LITHOGRAPHIC PATTERNING OF A GATE CONDUCTOR AFFECTS TRANSISTOR PROPERTIES

[75] Inventors: John J. Bush, Leander; Jon D. Cheek, Round Rock; Mark I. Gardner, Cedar Creek, all of Tex.

[73] Assignee: Advanced Micro Devices, Sunnyvale, Calif.

[21] Appl. No.: 09/030,751

[22] Filed: Feb. 25, 1998

[51] Int. Cl.⁶ .......................... H01L 23/58; G01R 31/26
[52] U.S. Cl. .......................... 257/48; 324/765; 324/769; 438/11; 438/18
[58] Field of Search ........................ 257/48, 206; 438/11, 438/18; 324/530, 750, 765, 769

[56] References Cited

U.S. PATENT DOCUMENTS

| | | |
|---|---|---|
| 3,751,647 | 8/1973 | Maeder et al. . |
| 3,842,491 | 10/1974 | Depuy et al. . |
| 5,553,274 | 9/1996 | Liebmann . |
| 5,705,301 | 1/1998 | Garza et al. . |
| 5,707,765 | 1/1998 | Chen . |
| 5,723,233 | 3/1998 | Garza at el. . |
| 5,773,315 | 6/1998 | Jarvis . |

*Primary Examiner*—Mahshid Saadat
*Assistant Examiner*—Allan R. Wilson
*Attorney, Agent, or Firm*—Kevin L. Daffer; Conley, Rose & Tayon

[57] ABSTRACT

The present invention advantageously provides a test structure and method for determining how lithographic patterning of transistor gate conductors laterally spaced from conductors affects the operation of transistors which employ the gate conductors. The test structure includes a sequence of gate conductors interposed above and between a respective sequence of source and drain regions. The test structure further includes a sequence of conductors which have been patterned from the same material as the gate conductors. The conductors are spaced an increasing distance from respective gate conductors. The gate conductors extend beyond the respective source and drain regions by varying distances or by the same distance. Lithographic patterning of the gate conductors and the conductors may result in the edges of the gate conductors and the conductors being substantially round and absent of sharp corners. Further, lithographic patterning may lead to a reduction in the lengths of the gate conductors and the conductors. The length of each gate conductor extends along the same axis as the length of the conductor nearest to the gate conductor.

13 Claims, 6 Drawing Sheets

TEST STRUCTURE FOR DETERMINING HOW LITHOGRAPHIC PATTERNING OF A GATE CONDUCTOR AFFECTS TRANSISTOR PROPERTIES

BACKGROUND OF THE INVENTION

1. Field of the Invention

This invention relates to integrated circuit fabrication and, more particularly, to forming a test structure in which a sequence of conductors are spaced by an increasing distance from a respective sequence of gate conductors. The test structure may be used to determine how lithographic patterning of the gate conductors laterally spaced from the conductors affects the operation of transistors employing the gate conductors.

2. Description of the Related Art

Fabrication of a MOSFET device is well known. Generally speaking, MOSFETs are manufactured by placing an undoped polycrystalline silicon ("polysilicon") material over a relatively thin gate oxide. The polysilicon material and the gate oxide are then patterned to form a gate conductor with source/drain regions adjacent to and on opposite sides of the gate conductor. The gate conductor and source/drain regions are then implanted with an impurity dopant species. If the impurity dopant species used for forming the source/drain regions is n-type, then the resulting MOSFET is an NMOSFET ("n-channel") transistor device. Conversely, if the source/drain dopant species is p-type, then the resulting MOSFET is a PMOSFET ("p-channel") transistor device. Integrated circuits utilize either n-channel devices exclusively, p-channel devices exclusively, or a combination of both on a single substrate. While both types of devices can be formed, the devices are distinguishable based on the dopant species used.

An integrated circuit typically includes multiple isolated devices arranged upon and within a unitary substrate. Various devices are electrically linked together with interconnect routing residing above and extending between contacts that have been formed through an interlevel dielectric to the devices. As such, the gate conductor of a MOSFET device is commonly formed coaxial to and isolated from another conductor which is to be employed by a separate device, e.g. a capacitor. FIGS. 1–3 illustrate the simultaneous formation of a gate conductor and a conductor which are laterally spaced apart and extend along the same axis. As shown in FIG. 1, a semiconductor substrate 2 is provided within which a trench isolation structure 4 has been formed. A gate dielectric 6 is arranged across the upper surface of substrate 2. A potentially conductive material 8 (e.g., polysilicon that may be subsequently rendered conductive with dopants), is shown deposited across gate dielectric 6. Also, a photosensitive material, i.e., photoresist 10 has been spin-on deposited across the upper surface of substrate 2.

FIG. 2 demonstrates a partially transparent mask plate 12 which may be used to pattern photoresist 10 using a well-known technique known as "lithography". Mask plate 12 includes transparent region 13 and non-transparent regions 14. The sizes and shapes of non-transparent regions 14 are equivalent to the sizes and shapes of the ensuing gate conductor and conductor which are to be formed from conductive material 8. The configuration of transparent region 13 with respect to non-transparent regions 14 is applicable when photoresist 10 is a positive photoresist. However, if photoresist 10 is a negative photoresist, transparent region 13 and non-transparent regions 14 would need to be reversed such that region 13 is non-transparent and region 14 is transparent. Mask plate 12 may be placed a relatively small spaced distance above photoresist 10 during the lithography process. Patterns upon mask plate 12 are projected upon photoresist 10 using a form of radiation, e.g., ultraviolet light. The radiation is transmitted exclusively through transparent portion 13 of mask plate 12 to photoresist 10, transferring an optical image to photoresist 10.

Diffraction effects may undesirably occur as the radiation passes through the slit-like area 15 of transparent region 13 interposed between the two non-transparent regions 14. As a result, the radiation projected onto photoresist 10 may have an intensity distribution of light and dark bands. It is well known that a series of slits which, when irradiated with coherent light, will emit diffraction patterns which interfere with each other to produce an intensity pattern of light over a wide range of diffraction orders, n. Unfortunately, only a small number of the lower orders of light are able to pass through the lens system of the exposure tool used to project the radiation to mask plate 12. Absent the higher orders of light, the image projected onto photoresist 10 may lack some of the characteristics of the original mask pattern. In particular, sharp corners in the mask pattern may be lost, resulting in a projected image with rounded corners. Further, the length of the projected image may be shorter than that of the original mask pattern.

The solubility of the region of positive photoresist 10 exposed to the radiation is altered by a photochemical reaction and thus may be washed away with a solvent to form a photoresist pattern like that of the projected image. Alternately, if a negative photoresist 10 is used, those regions of photoresist 10 exposed to the radiation are retained while the unexposed region is washed away. Subsequently, the now-patterned photoresist 10 is exposed to an etchant that removes those portions of conductive material 8 and gate dielectric 6 unprotected (i.e., not covered) by the photoresist 10. In this manner, a conductor 16 is formed a spaced distance from a gate conductor 18, as shown in FIG. 3. Dashed lines 17 represent where conductor 17 and gate conductor 18 would have been located had there been no damaging diffraction effects during the exposure of photoresist 10. However, since the photoresist pattern is dissimilar from the original mask pattern, conductor 16 and gate conductor 18 are not shaped and sized exactly as they would have been if no diffraction effects had occurred. Consequently, instead of having well-defined corners, the ends of conductor 16 and gate conductor 18 become more curved as the spacing between the conductors decreases. Further, the lengths of conductor 16 and gate conductor 18 which extend along the same axis 23 are reduced relative to their corresponding patterns in mask plate 12.

In subsequent processing steps, impurity dopants may be implanted into source and drain regions 19 of substrate 10 which are bounded by an isolation region 4. Gate conductor 18 serves as a masking layer during the source/drain implant so that dopant species are inhibited from being implanted into the channel region of substrate 10 underlying gate conductor 18. Since the gate length of gate conductor 18 may become shorter than its design specification, gate conductor 18 might not extend across the entire length of source and drain regions 19. Therefore, source and drain regions 19 undesirably communicate with each other between the end of shortened gate conductor 18 and isolation region 4. Unfortunately, due to the shortening of gate conductor 18 and the rounding of the corners of gate conductor 18, a subthreshold current may inadvertently flow between source and drain regions 19 when the transistor is in its off state. The rounding of the corners of the gate conductor 18 contribute to the current leakage between source and drain regions 19 by reducing the distance between those regions. While a gate conductor patterned a spaced distance from another conductor might not be shortened to the extent shown in FIG. 3, even a small amount of shortening might lead to some current leakage between adjacent source and drain regions. Moreover, the drive current of an operating transistor in which the gate conductor has rounded edges and hence a reduced gate width might fluctuate from design specification. As the device dimensions and the spacing between device dimensions have continuously been reduced, the distance by which a gate conductor extends beyond the source and drain regions has also been decreased. Consequently, it has become more probable that gate conductor shortening and rounding of the gate conductor corners will result in current leakage between adjacent source and drain regions.

It would therefore be of benefit to determine the effect that lithographic patterning of a gate conductor spaced from a conductor of similar material has on the properties of the transistor which employs the gate conductor. A test structure and method must be developed for comparing the properties of transistors having gate conductors lithographically patterned varying distances from other conductors. Such a test structure would allow one to determine the spacing required between a gate conductor and another conductor to significantly reduce current leakage between source and drain regions adjacent to the gate conductor. Further, a test structure is needed which could be used to determine how far the gate conductor must extend beyond the source and drain regions to provide sufficient protection against current leakage. Such a test structure would also allow one to characterize the relationship between the rounding and shortening of a gate conductor of a transistor and electrical properties resulting from that transistor.

SUMMARY OF THE INVENTION

The problems outlined above are in large part solved by the test structure hereof, and a method for using the test structure to determine how lithographic patterning of transistor gate conductors laterally spaced from similar conductors affects the operation of transistors which employ the gate conductors. The test structure includes a sequence of gate conductors interposed above and between a respective sequence of source and drain regions. The test structure further includes a sequence of conductors which have been patterned from the same material as the gate conductors. The conductors are spaced an increasing distance from respective gate conductors. The gate conductors extend beyond the respective source and drain regions by varying distances or by the same distance. Lithographic patterning of the gate conductors and the conductors may result in the edges of the gate conductors and the conductors being substantially round and absent of sharp corners. Further, lithographic patterning may lead to a reduction in the lengths of the gate conductors and the conductors. The length of each gate conductor extends along the same axis as the length of the conductor nearest to the gate conductor.

Once the test structure has been fabricated, the subthreshold drive currents, $I_{st}$ (i.e., the current inadvertently flowing between source and drain regions of a transistor in its off state) and drive current, $I_D$, for all of the transistors may be measured and compared. From such a comparison, it may be possible to determine the effect that varying the distance between a gate conductor and another conductor patterned concurrently with the gate conductor has on the properties of a transistor. In particular, the test structure may allow one to determine how transistor drive current and subthreshold current vary as a function of the pre-designed spacing between a gate conductor and another conductor. As the distance between the gate conductor pattern and the conductor pattern on a lithography masking plate decreases, the diffraction effects experienced by the radiation passing through the masking plate are increased. As a result, the degree of rounding and shortening of a gate conductor patterned a spaced distance from another conductor may increase. Unfortunately, extending the gate conductor farther beyond the source and drain regions in an attempt to counter the shortening and rounding of the gate conductor reduces the critical spacing between the gate conductor and the conductor. Hence, a test structure which includes gate conductors that extend beyond corresponding source and drain regions by varying distances, and which are spaced varying distances from conductors may provide valuable information. Such a test structure allows one to balance the gate conductor length with the spacing between the gate conductor and the conductor to implement design rules to significantly reduce or prevent current leakage in the transistor.

The present invention contemplates a test structure which includes a sequence of gate conductors interposed above and between a respective sequence of source and drain regions. The test structure also includes a sequence of conductors patterned from the same material as the gate conductors, wherein the conductors are spaced an increasing distance from respective gate conductors. In one embodiment, the sequence of gate conductors extend beyond the respective sequence of source and drain regions by an equivalent distance. In another embodiment, the sequence of gate conductors extend beyond the respective sequence of source and drain regions by an increasing distance. Formation of the gate conductors and conductors involves chemical-vapor deposition ("CVD") of a semiconductive or conductive material, preferably polysilicon, across a gate dielectric arranged upon a semiconductor substrate. Select regions of the polysilicon and the gate dielectric are removed using lithography, followed by an etch technique, e.g., a plasma etch, thereby concurrently patterning the gate conductors and conductors. A polysilicon conductor which electrically links the gate conductors to a subsequently formed probe pad is also defined as a result of the removal of portions of the polysilicon.

A source/drain implant which is self-aligned to opposed sidewall surfaces of the gate conductors is then forwarded into the substrate to form the source and drain regions. The source and drain regions are bound by isolation regions previously formed within the substrate. An interlevel dielectric is deposited across the surface of the resulting semiconductor topography. Contact openings are etched through the interlevel dielectric to the source and drain regions. Trenches for conductors and probe pads are then etched in the upper surface of interlevel dielectric. A conductive material is deposited into the contact openings and the trenches to a level spaced above the interlevel dielectric. The conductive material may be subjected to chemical-mechanical polishing ("CMP") to remove the upper surface of the conductive material to a level approximately commensurate to the upper surface of the interlevel dielectric. In this manner, isolated conductors which terminate at probe pads (i.e., metal structures to which electrical probes may be applied) are formed across the interlevel dielectric to contacts. A source conductor electrically links all of the contacts coupled to source regions to a source probe pad. Drain conductors extend between the contacts coupled to each drain region and to respective drain probe pads. A contact may also be formed between the polysilicon conductor and an overlying gate probe pad.

Various electrical tests may be performed on the test structure to determine how varying the spacing between the gate conductors and the conductors affects transistor properties. A signal generator/detector may serve as a power supply operably coupled to the source regions, drain regions, and gate conductors as well as a detector operably coupled to the drain regions. For example, if the transistors are NMOS transistors, the subthreshold current of each transistor may be measured by using the signal generator/detector to ground the gate conductor of each transistor, ground the source region of each transistor, ground the substrate, and apply a voltage to the drain region of each transistor. The subthreshold current inadvertently flowing between the source and drain regions of each transistor may then be measured. Electrical probes which are coupled to the generator/detector may be contacted to the source pad, the drain pads, and the gate pad in order to perform the electrical test. A comparison may be made between the different properties of the transistors to determine the optimum configuration of the gate conductors with respect to the source and drain regions and the conductors which are arranged coaxial to the gate conductors.

BRIEF DESCRIPTION OF THE DRAWINGS

Other objects and advantages of the invention will become apparent upon reading the following detailed description and upon reference to the accompanying drawings in which.

Figure 1:
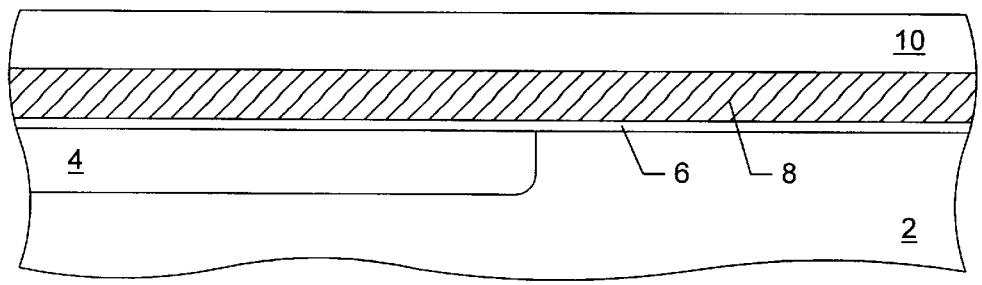
FIG. 1 depicts a cross-sectional view of a semiconductor topography according to a conventional design, wherein a polysilicon layer is dielectrically spaced above a semiconductor substrate and photoresist is formed across the polysilicon layer.
Figure 2:
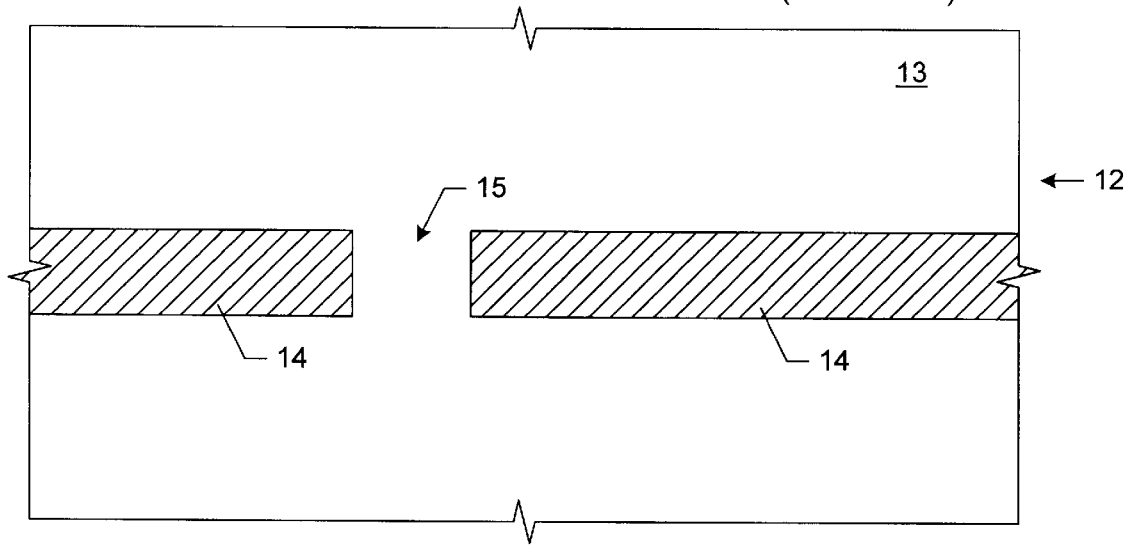
FIG. 2 depicts a top plan view of a lithography masking plate according to conventional design, wherein the masking plate includes a pattern to define a gate conductor spaced from and coaxial to a conductor.
Figure 3:
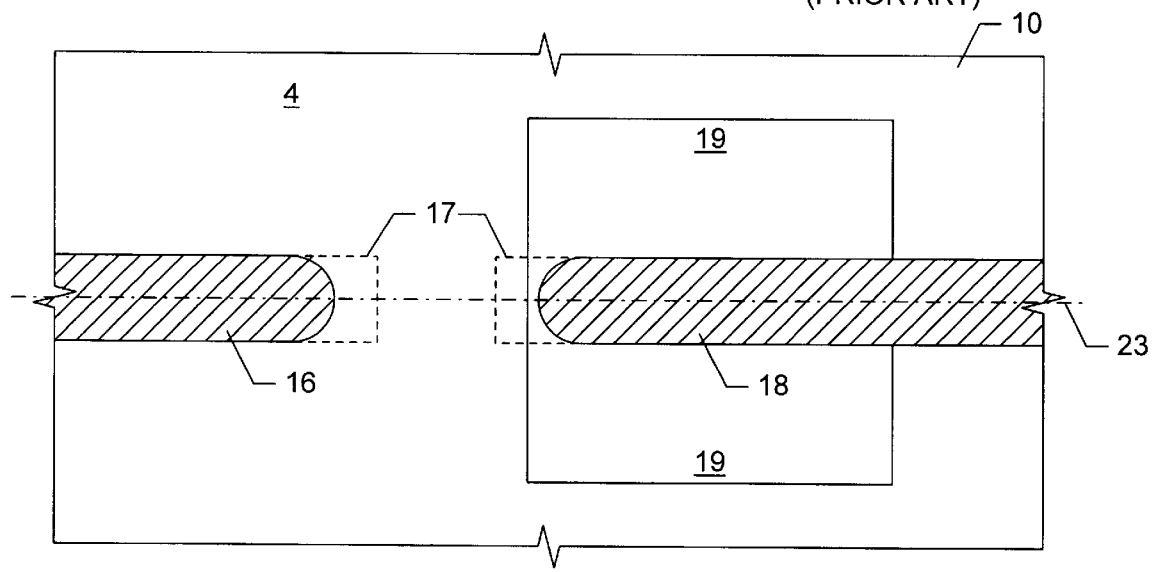
FIG. 3 depicts a top plan view of the semiconductor topography, wherein the polysilicon layer has been patterned using lithography and etch to define the gate conductor and the conductor.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
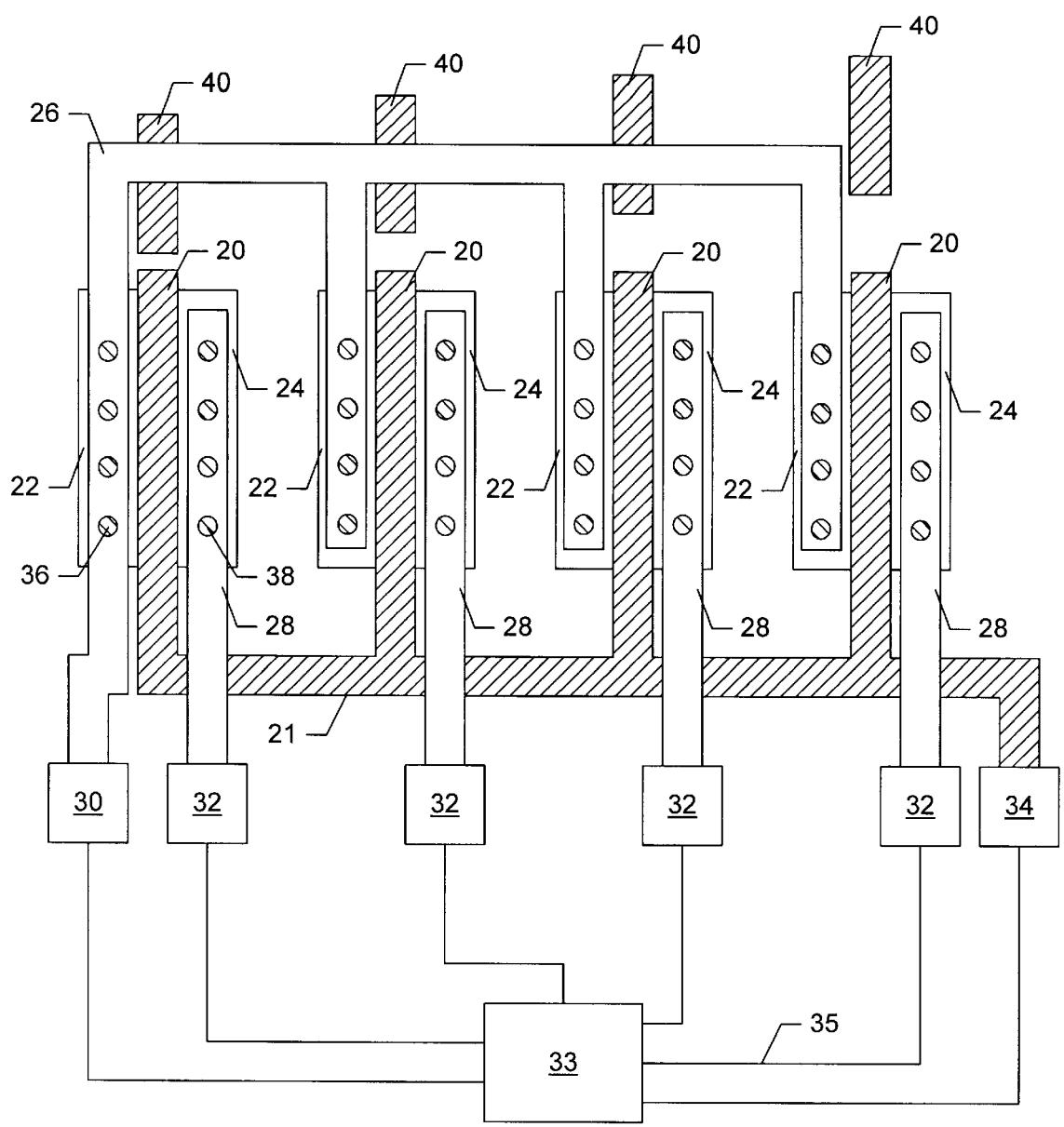
FIG. 4 depicts a top plan view of a test structure according to an embodiment of the present invention, wherein a sequence of gate conductors is arranged above and between a respective sequence of source and drain regions and a sequence of conductors are spaced by an increasing distance from the respective sequence of gate conductors.
Figure 5:
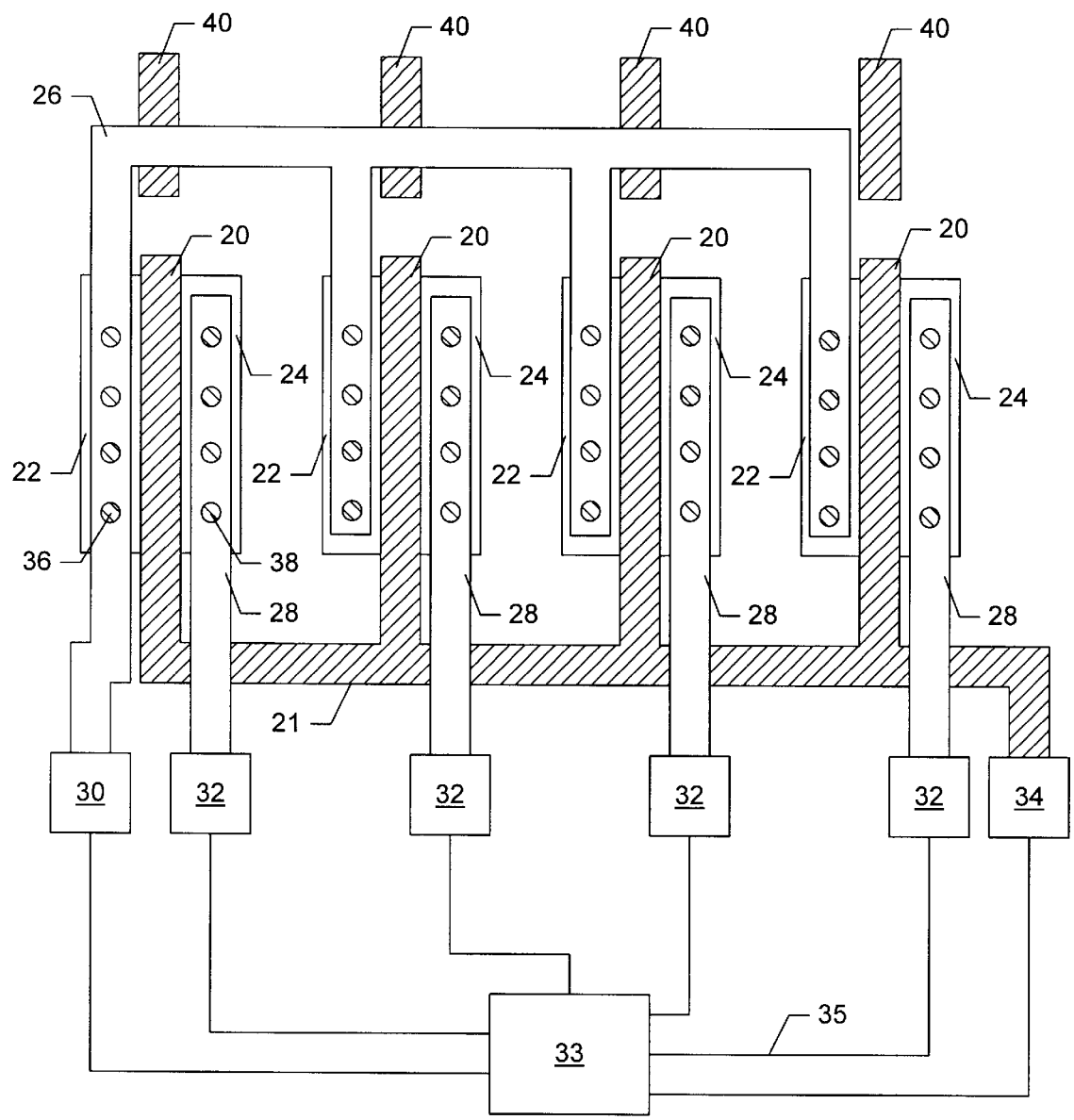
FIG. 5 depicts a top plan view of a test structure according to an alternate embodiment of the present invention, wherein a sequence of gate conductors is arranged above and between a respective sequence of source and drain regions, a sequence of conductors are spaced by an increasing distance from the respective sequence of gate conductors, and the sequence of gate conductors extend by an increasing distance beyond the respective sequence of source and drain regions.

FIGS. 4 and 5 depict top plan views of two test structures according to alternate embodiments of the present invention. The test structures shown in FIGS. 4 and 5 are have similar features. Both test structures include a sequence of conductors 40 spaced an increasing distance from a respective sequence of gate conductors 20 which extend along the same axis as the conductors 40. The conductors 40 and gate conductors 20 are composed of the same material, preferably doped polysilicon. Each gate conductor 20 is arranged above and between a source region 22 and a drain region 24 of a semiconductor substrate. According to the embodiment of the test structure shown in FIG. 4, gate conductors 20 extend beyond source and drain regions 22 and 24 in a direction toward conductors 40 by a substantially equivalent distance. According to the embodiment of the test structure shown in FIG. 5, gate conductors 20 extend beyond source and drain regions 22 and 24 in a direction toward conductors 40 by dissimilar distances. A doped polysilicon conductor 21 electrically links each of the gate conductors 20 to a gate probe pad 34. Conductive contacts 36 extend through an interlevel dielectric to source regions 36, and conductive contacts 38 extend through the interlevel dielectric to drain regions 24.

A conductor 26 extends horizontally across the interlevel dielectric, electrically linking source contacts 36 to a source probe pad 30. A sequence of conductors 28 also extend across the interlevel dielectric, electrically linking drain contacts 38 to a respective sequence of drain probe pads 32. Contacts 36 and 38 and conductors 26 and 28 may be composed of a metal, e.g., tungsten, titanium, copper, or aluminum. It is to be understood that conductors 26 and 28 may be arranged in a different orientation to that shown in FIGS. 4 and 5 and that probe pads 30, 32, and 34 may also be arranged at different locations to those illustrated. A signal generator/detector 33, e.g., a three-point probe, for applying and receiving electrical signals to probe pads 30, 32, and 34 is also depicted. The electrical signals pass from signal generator/detector 33 to probe pads 30, 32, and 34, and vice versa, through electrical wires 35.

The test structure depicted in FIGS. 4 and 5 are merely plan views as designed. It is noted that lithographic limitations will cause shortening or rounding effects upon the "plan" design. The resulting test structure will therefore have slightly different features on silicon than that shown. Those features are implicit from the plan as drawn. The test structure may be used to determine how varying the distance between each gate conductor 20 and a conductor 40 proximate the gate conductor affects the characteristics of the transistor employing that gate conductor 20. During fabrication of the test structure, lithographic patterning of gate conductors 20 and conductors 40 may result in the ends of the those structures being round rather than having sharp corners. Further, the lithography patterning may cause the lengths of gate conductors 20 and conductors 40 to be reduced. The extent of the shortening and rounding of gate conductors 20 and conductors 40 is dependent upon the spacing between gate conductors 20 and conductors 40. As such, electrical testing of the test structure depicted in FIG. 4 after it has been fabricated may be used to determine the effect that the spaced distance patterned between a gate conductor and a conductor has on transistor properties. Accordingly, the test structure shown in FIG. 4 may be used to determine the distance that should be allotted between a gate conductor and a conductor arranged coaxial to the gate conductor in the layout of a circuit. The test structure illustrated in FIG. 5 accounts for the fact that extending the gate conductor father beyond the source and drain regions affords protection against transistor current leakage due to gate conductor shortening and rounding. However, extending the gate conductor in this manner also results in the gate conductor being moved closer to the adjacent conductor, and thus may increase the amount of gate conductor shortening and rounding. Therefore, the test structure depicted in FIG. 5 may be used to determine the optimum balance between (a) the distance between the gate conductor and the conductor and (b) the distance the gate conductor extends past the source and drain regions.

Electrical testing of the transistors of the test structure depicted in FIGS. 4 and 5 involves, in one case, applying an equivalent voltage, e.g., 2.0 Volts in magnitude, to each drain pad 32 and grounding the gate probe pad 34, the source probe pad 30, and the substrate of an NMOS transistor. If any subthreshold current, $I_{st}$, leaks between the source and drain regions 22 and 24 of each transistor, it may be detected by coupling signal generator/detector 33 to the corresponding one of the drain probe pads 32. The drive current of each transistor may also be determined by applying a voltage, $V_{gs}$ that is greater than the transistor threshold voltage, $V_T$, to gate probe pad 34 and applying another voltage, $V_{DD}$, to each drain probe pad 32. Source probe pads 30 and the bulk substrate may be grounded. In this manner, the channel region of the substrate underlying each gate conductor 20 may be inverted, and a drive current, $I_D$, may flow between each pair of source and drain regions 22 and 24. The drive current for each transistor may be determined by using signal generator/detector 33 to measure the current drawn to the corresponding drain probe pad 32. Electrical testing may also be done on a PMOS transistor by grounding the source pad 30, the gate probe pad 34, and the substrate, while applying a voltage, e.g., 2.0 volts, to the drain pad 32 to determine subthreshold leakage as measured in the drain probe pad 32.

Figure 6:
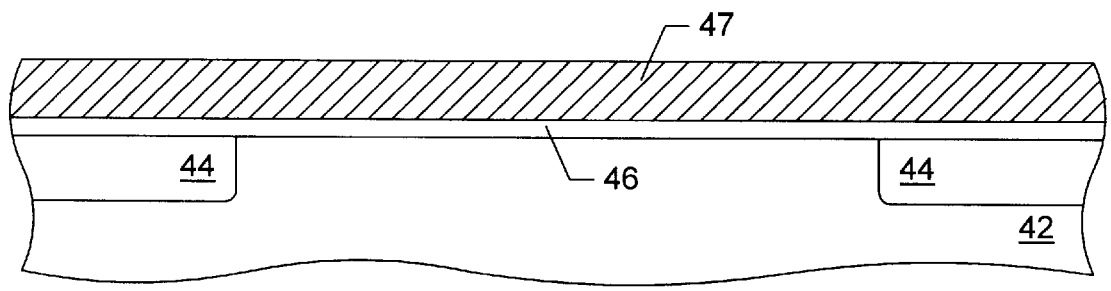
FIG. 6 depicts a cross-sectional view of the formation of one of the transistors of the test structure shown in either FIG. 4 or FIG. 5, wherein a polysilicon layer is deposited across a gate dielectric arranged upon a semiconductor substrate.

FIGS. 6–13 depict a partial cross-sectional view of the formation of one of the transistors of the test structure depicted in either FIG. 4 or FIG. 5. Turning to FIG. 6, substrate 42 comprises single crystalline silicon which has been lightly doped with either n-type or p-type dopant species. Dielectric isolation regions, such as shallow trench isolation structures 44, are arranged spaced distances apart within substrate 42 for dielectrically isolating ensuing transistors. The dielectric isolation regions may alternately include well-known LOCOS structures. Substrate 42 is slightly doped with n-type or p-type impurities. A gate dielectric 46 is formed across substrate 42 by, e.g., subjecting silicon-based substrate 42 to thermal radiation in an oxygen bearing ambient. As such, gate dielectric 46 may be composed of a thermally grown oxide. A polysilicon layer 47 may be formed across gate dielectric 46 using chemical-vapor deposition ("CVD") of polysilicon from, e.g., a silane source. Polysilicon layer 47 may subsequently be rendered conductive by implanting dopant species into the polysilicon layer.

Figure 7:
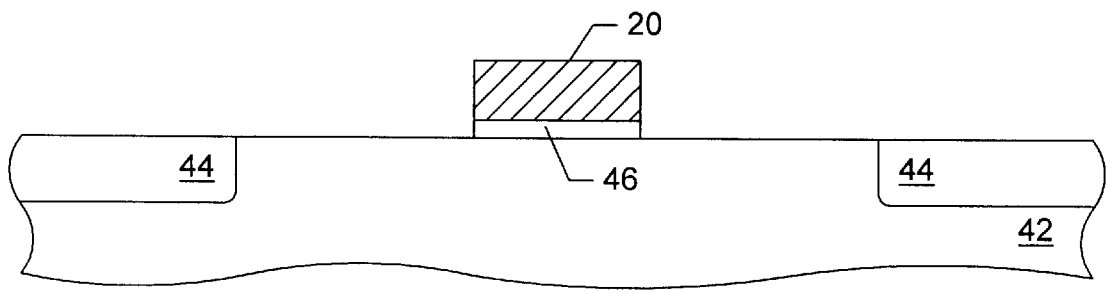
FIG. 7 depicts a cross-sectional view of the formation of one of the transistors of the test structure shown in either FIG. 4 or FIG. 5, wherein portions of the polysilicon layer are etched from above the substrate to define a gate conductor, subsequent to the step in FIG. 6.

As shown in FIG. 7, portions of polysilicon layer 47 and gate dielectric 46 are then removed to form polysilicon gate conductor 20 dielectrically spaced above substrate 42. Gate conductor 20 is defined by first patterning a photoresist layer across select regions of polysilicon layer 47 using lithography. Those portions of polysilicon layer 47 unprotected by overlying photoresist are then etched using, e.g., a dry, plasma etch. The etch duration is chosen to terminate before substantial portions of either gate dielectric 46 or substrate 42 are removed. While FIG. 7 depicts the entire thickness of gate dielectric 46 being removed from above substrate 42, it is more desirable to retain a portion of gate dielectric 46 above substrate 42 so as to aid the distribution of dopant species subsequently implanted into the substrate.

Figure 8:
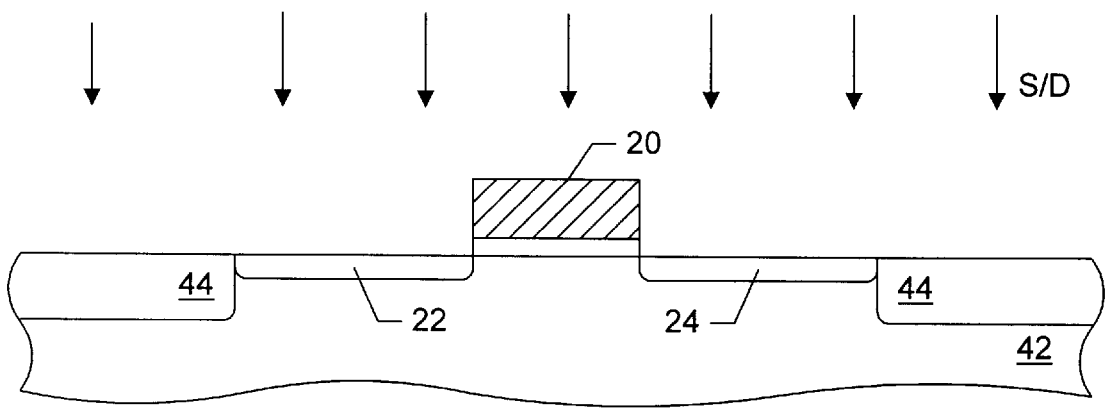
FIG. 8 depicts a cross-sectional view of the formation of one of the transistors of the test structure shown in either FIG. 4 or FIG. 5, wherein source/drain implants that are self-aligned to the opposed sidewall surfaces of the gate conductor are forwarded into the substrate to form source and drain regions, subsequent to the step in FIG. 7.

As depicted in FIG. 8, dopant species may then be implanted into substrate 42 at a relatively high dose and energy to form source region 22 laterally spaced from drain region 24. If a PMOSFET device is being formed, p-type species are implanted into substrate 42, and if an NMOSFET device is being formed, n-type species are implanted into substrate 42. Some commonly used n-type dopants are arsenic or phosphorus, and some commonly used p-type dopants are boron or boron difluoride. Gate conductor 38 serves as a mask during the source/drain implant to inhibit dopant species from passing into the channel region of the substrate 42 underneath gate conductor 20. The dopant pieces that become positioned within gate conductor 20 advantageously serve to lower the resistivity of the gate conductor. A post-implant anneal may be performed to activate and position the as-implanted impurities. It is to be understood that lightly doped drain areas may also be formed within substrate 42 between the opposed sidewall surfaces of gate conductor 20 and the source and drain regions 22 and 24 using well-known techniques.

Figure 9:
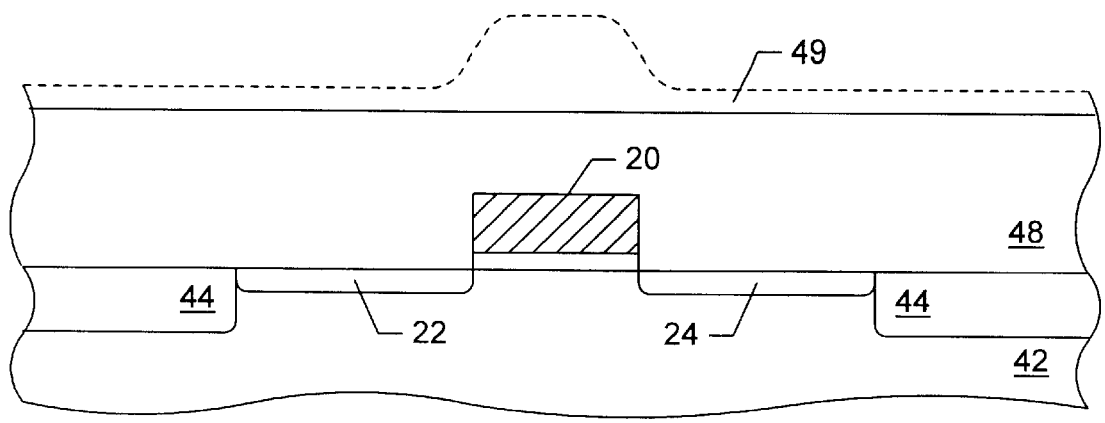
FIG. 9 depicts a cross-sectional view of the formation of one of the transistors of the test structure shown in either FIG. 4 or FIG. 5, wherein an interlevel dielectric is formed across exposed surfaces of the gate conductor and the substrate, subsequent to the step in FIG. 8.
Figure 10:
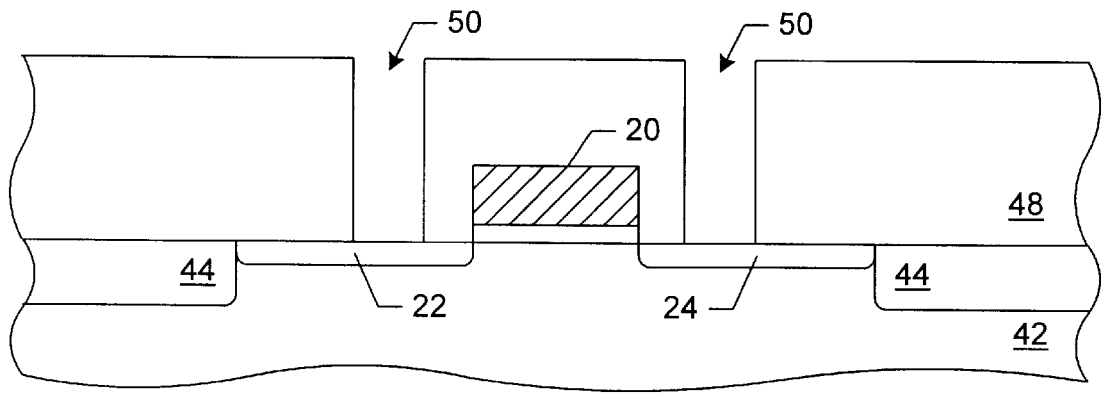
FIG. 10 depicts a cross-sectional view of the formation of one of the transistors of the test structure shown in either FIG. 4 or FIG. 5, wherein contact openings are etched through the interlevel dielectric to the source and drain regions, subsequent to the step in FIG. 9.
Figure 11:
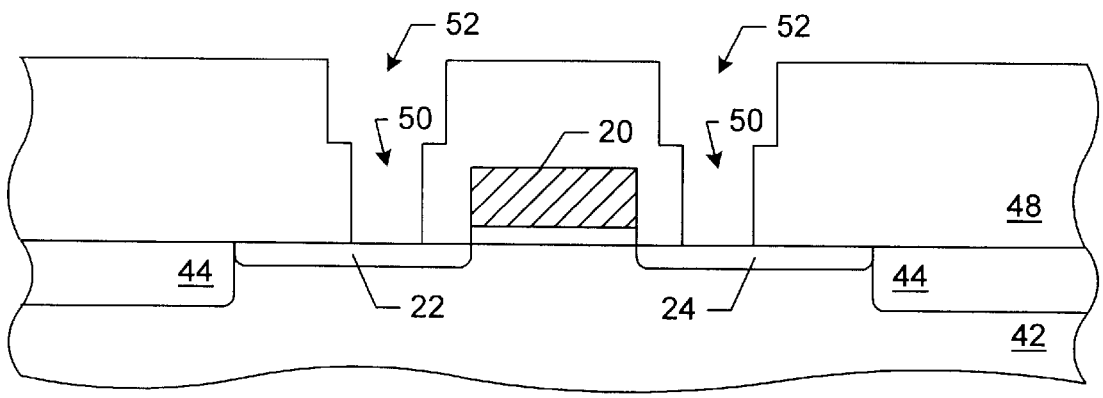
FIG. 11 depicts a cross-sectional view of the formation of one of the transistors of the test structure shown in either FIG. 4 or FIG. 5, wherein horizontally extending trenches which communicate with the contact openings are etched in the interlevel dielectric a spaced distance above the substrate, subsequent to the step in FIG. 10.

FIG. 9 depicts the formation of an interlevel dielectric 48 across exposed surfaces of substrate 42 and gate conductor 20. Interlevel dielectric 48 may be formed by the CVD deposition of an oxide- or glass-based dielectric material 49. Dielectric material 49 may be subjected to a CMP polish to remove the surface of the dielectric material down to a level spaced above gate conductor 20. The surface of the resulting interlevel dielectric 48 is substantially planar. As shown in FIG. 10, contact openings 50 may then be formed through interlevel dielectric 48 to source and drain regions 22 and 24 using optical lithography and an etch technique, e.g., a dry, plasma etch.. FIG. 11 depicts the formation of horizontally extending trenches 52 a spaced distance above substrate 30.

Trenches 52 which communicate with contact openings 50 are etched within interlevel dielectric 48.

Figure 12:
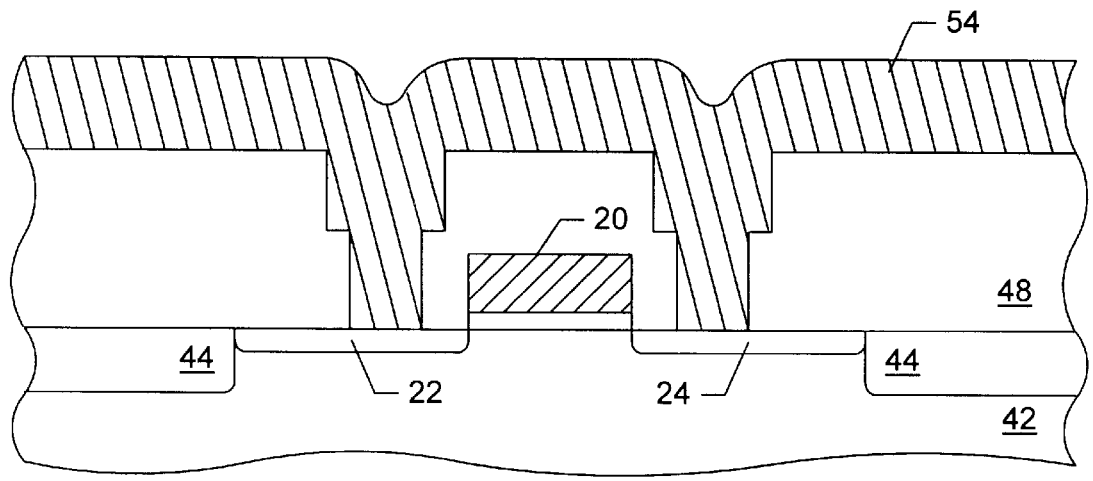
FIG. 12 depicts a cross-sectional view of the formation of one of the transistors of the test structure shown in either FIG. 4 or FIG. 5, wherein a conductive material is deposited into the contact openings and the trenches to a level spaced above the upper surface of the interlevel dielectric, subsequent to the step in FIG. 11.
Figure 13:
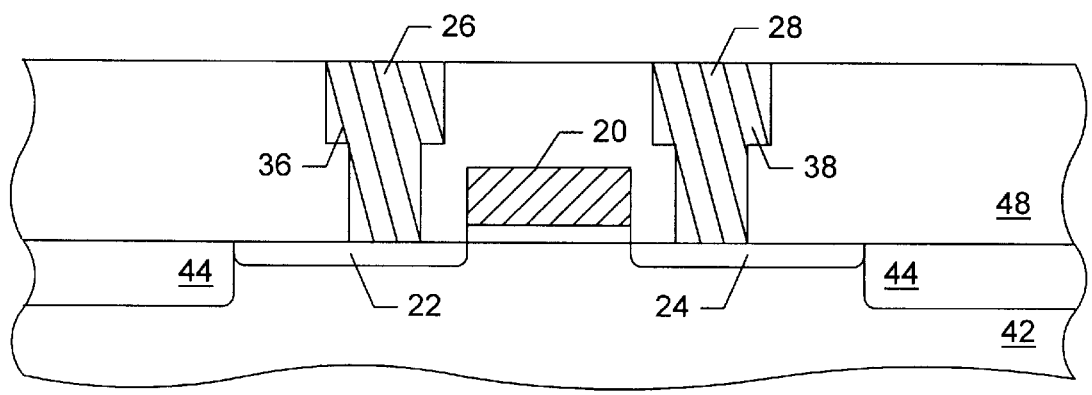
FIG. 13 depicts a cross-sectional view of the formation of one of the transistors of the test structure shown in either FIG. 4 or FIG. 5, wherein the conductive material and the interlevel dielectric are removed down to a level approximately commensurate with the upper surface of the interlevel dielectric to form contacts and conductors, subsequent to the step in FIG. 12.

Turning to FIG. 12, a conductive material 54, e.g., tungsten, is then deposited into contact openings 50 and trenches 52 to an elevational level spaced above the upper surface of interlevel dielectric 48. As depicted in FIG. 13, the upper surface of conductive material 54 is removed down to a level approximately commensurate to the upper surface of interlevel dielectric 48 using, e.g., CMP. In this manner, a horizontally extending conductor 26 and a contact 36 are formed in electrical communication with source region 22. Also, a horizontally extending conductor 28 and a contact 38 are formed in electrical communication with drain region 24. The resulting planar upper surface of the semiconductor topography is shared by interlevel dielectric 48 and conductors 26 and 28. Alternatively, contacts 36 and 38 may be formed prior to the formation of conductors 26 and 28, and the contacts and the conductors may be composed of dissimilar materials.

It will be appreciated to those skilled in the art having the benefit of this disclosure that this invention is believed to provide a test structure and method for determining how lithographic patterning of gate conductors laterally spaced from conductors affects the operation of transistors employing the gate conductors. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A lithography test mechanism, comprising:
    a sequence of gate conductors interposed above and between a respective sequence of source and drain regions;
    a sequence of conductors patterned from the same material as the gate conductors, wherein the conductors are spaced by an increasing first distance from respective said gate conductors;
    a first power supply operably coupled to the source region and a second power supply operably coupled to the gate conductors; and
    a detector operably coupled to the drain regions.

2. The lithography test mechanism as recited in claim 1, wherein the detector comprises a current measuring device for determining current drawn to each of the drain regions dependent on a reduction in a gate length of a corresponding one of the gate conductors proximate to the each of the drain regions.

3. The lithography test mechanism as recited in claim 2, wherein the first power supply is adapted to draw the current from each of the source regions to a corresponding one of the drain regions proximate the each of the source regions.

4. The lithography test mechanism as recited in claim 2, wherein the reduction in the gate length results from (a) a lithographic patterning of the sequence of gate conductors and the sequence of conductors and (b) an opening of a space between each of the gate conductors and a corresponding one of the conductors closest to the each of the gate conductors.

5. The lithography test mechanism as recited in claim 2, wherein the sequence of gate conductors are configured coaxial to the respective said sequence of conductors.

6. The lithography test mechanism as recited in claim 1, wherein the sequence of gate conductors extend an increasing second distance beyond the respective sequence of source and drain regions.

7. A lithography test structure comprising:
    a sequence of gate conductors interposed above and between a respective sequence of source and drain regions, the source and drain regions being arranged within a semiconductor substrate; and
    a sequence of conductors patterned from the same material as the gate conductors, wherein the conductors are spaced an increasing first distance from respective said sequence of gate conductors.

8. The lithography test structure of claim 7, further comprising an interconnect electrically linking the gate conductors to a gate probe pad.

9. The lithography test structure of claim 7, further comprising:
    an interlevel dielectric arranged across the sequence of gate conductors and the semiconductor substrate; and
    conductive contacts extending through the interlevel dielectric to each of the source and drain regions.

10. The lithography test structure of claim 9, further comprising a source conductor extending across the interlevel dielectric and electrically linking each of the source regions to a source probe pad.

11. The lithography test structure of claim 9, further comprising a sequence of drain conductors extending across the interlevel dielectric and electrically linking each of the drain regions to a corresponding one of a sequence of drain probe pads.

12. The lithography test structure of claim 9, wherein the sequence of gate conductors extend an increasing second distance beyond the respective sequence of source and drain regions.

13. The lithography test structure of claim 7, wherein the sequence of gate conductors are configured coaxial to the respective said sequence of gate conductors.

* * * * *